United States Patent
Maghribi et al.

(10) Patent No.: US 7,462,518 B2
(45) Date of Patent: Dec. 9, 2008

(54) SILICONE METALIZATION

(75) Inventors: Mariam N. Maghribi, Livermore, CA (US); Peter Krulevitch, Pleasanton, CA (US); Julie Hamilton, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 161 days.

(21) Appl. No.: 11/586,271

(22) Filed: Oct. 24, 2006

(65) Prior Publication Data

US 2007/0037315 A1 Feb. 15, 2007

Related U.S. Application Data

(62) Division of application No. 10/295,096, filed on Nov. 14, 2002, now Pat. No. 7,145,229.

(51) Int. Cl.
*H01L 21/44* (2006.01)

(52) U.S. Cl. ........................ 438/149; 438/151; 438/166; 438/459; 438/778; 257/E21.122; 257/E21.567; 257/E21.649

(58) Field of Classification Search ................. 438/106, 438/149, 151, 166, 459, 778; 257/E21.122, 257/E21.567, E21.649
See application file for complete search history.

(56) References Cited

U.S. PATENT DOCUMENTS

| 4,557,037 | A | * | 12/1985 | Hanoka et al. ................. 438/57 |
| 5,346,850 | A | | 9/1994 | Kaschmitter et al. |
| 5,395,481 | A | | 3/1995 | McCarthy |
| 5,399,231 | A | | 3/1995 | McCarthy |
| 5,414,276 | A | | 5/1995 | McCarthy |
| 5,817,550 | A | | 10/1998 | Carey et al. |
| 6,596,569 | B1 | * | 7/2003 | Bao et al. .................... 438/151 |
| 6,949,452 | B2 | * | 9/2005 | Hatano et al. ............... 438/488 |
| 2003/0097166 | A1 | | 5/2003 | Krulevitch et al. |
| 2003/0203271 | A1 | | 10/2003 | Morse et al. |
| 2004/0121528 | A1 | * | 6/2004 | Krulevitch et al. .......... 438/166 |
| 2004/0209396 | A1 | * | 10/2004 | Krulevitch et al. .......... 438/106 |

OTHER PUBLICATIONS

Maghribi, M., et al., "Stretchable Micro-Electrode Array for Retinal Prothesis," 2nd Annual International IEEE-EMBS Special Topic Conference on Microtechnologies in Medicine and Biology, May 2-4, 2002, Proceedings, 2002, Piscataway, NJ, pp. 80-83.

* cited by examiner

*Primary Examiner*—Michael S Lebentritt
(74) *Attorney, Agent, or Firm*—Eddie E. Scott; John H. Lee

(57) ABSTRACT

A system for providing metal features on silicone comprising providing a silicone layer on a matrix and providing a metal layer on the silicone layer. An electronic apparatus can be produced by the system. The electronic apparatus comprises a silicone body and metal features on the silicone body that provide an electronic device.

1 Claim, 2 Drawing Sheets

SILICONE METALIZATION

CROSS-REFERENCE TO RELATED APPLICATIONS

This application is a division of U.S. application Ser. No. 10/295,096 filed Nov. 14, 2002 now U.S. Pat. No. 7,145,229 entitled "Silicone Metalization" by inventors Marian N. Maghribi, Peter A. Krulevitch, Julie K. Hamilton.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of Endeavor

The present invention relates to electronics and more particularly to producing metal features on silicone.

2. State of Technology

U.S. Pat. No. 5,817,550 for a method for formation of thin film transistors on plastic substrates to Paul G. Carey, Patrick M. Smith, Thomas W. Sigmon, and Randy C. Aceves issued Oct. 6, 1998 and assigned to Regents of the University of California provides the following background information, "Recently a process was developed for crystallizing and doping amorphous silicon on a low cost, so-called low-temperature plastic substrate using a short pulsed high energy source in a selected environment, without heat propagation and build-up in the substrate so as to enable use of plastic substrates incapable of withstanding sustained processing temperatures higher than about 180 degree C. Such a process is described and claimed in U.S. Pat. No. 5,346,850 issued Sep. 13, 1994 to J. L. Kaschmitter et al., assigned to the Assignee of the instant application. Also, recent efforts to utilize less expensive and lower temperature substrates have been carried out wherein the devices were formed using conventional temperatures on a sacrificial substrate and then transferred to another substrate, with the sacrificial substrate thereafter removed. Such approaches are described and claimed in U.S. Pat. No. 5,395,481 issued Mar. 7, 1995, U.S. Pat. No. 5,399,231 issued Mar. 21, 1995, and U.S. Pat. No. 5,414,276 issued May 9, 1995, each issued to A. McCarthy and assigned to the assignee of the instant application."

SUMMARY OF THE INVENTION

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system for providing metal features on silicone. The system comprises providing a silicone layer on a matrix and providing a metal layer on the silicone layer. An electronic apparatus can be produced by the system. The electronic apparatus comprises a silicone body and metal features on the silicone body that provide an electronic device.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
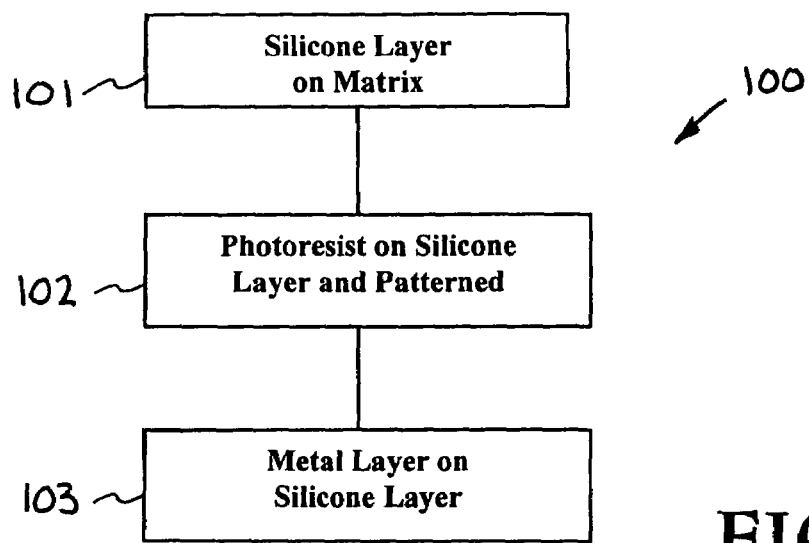
FIG. 1 is an illustration of an embodiment of a system for providing metal features on silicone.

Referring now to the drawings, to the following detailed information, and to incorporated materials; a detailed description of the invention, including specific embodiments, is presented. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to FIG. 1, an embodiment of the present invention is illustrated. The embodiment is designated generally by the reference numeral 100. The embodiment 100 comprises a number of steps for providing metal features on silicone. Applicants have developed the embodiment 100 process for fabricating stretchable metal traces on silicone. The embodiment 100 process can be implemented using a cost effective batch fabrication process. Applicants have demonstrated selective passivation of these metal traces with silicone exposing the traces only in areas needed to complete the electronic device. The embodiment 100 process provides metalizing silicone, selective passivation, using batch fabrication photolithographic techniques, to fabricate silicone, and produces stretchable metal traces that are capable of withstanding strains of 7% with S.D. 1.

In step 101 a silicone layer is provided on a matrix. The matrix provides a temporary base for production of the electronic devices. The matrix can be a mold, a handle wafer, or other base for producing the electronic device. In some embodiments the matrix can form part of the finished electronic device. A specific matrix for the embodiment 100 is a silicon handle wafer. Silicon wafers are convenient for the handle material because they are flat, stable, routinely used in microfabrication applications, and they are readily available. Materials such as glass, plastic, or ceramic can also be used. Silicone is spun onto the wafer at a desired thickness and cured. For example, the silicone may be cured at 66° C. for 24-48 hours. Silicone has very low water permeability and protects the electronic components from the environment.

The silicone is flexible and will conform to curved surfaces. It is transparent, stretchable, resinous, rubbery, stable in high temperatures and provides numerous electronic devices.

Step 102 is part of the process of forming the electrical circuit lines. A photoresist (AZ®1518, Clariant) is spun onto the silicone membrane surface at 1000 rpm for 20 seconds and baked at 60° C. for 20 minutes. The temperature is brought down slowly (30 min. to ramp temperature down) to room temperature to avoid cracking in the photoresist. Prior to photoresist application, the wafer is placed in an oxygen plasma to activate the surface. This allows the resist to wet the silicone surface preventing beading and ensuring the formation of a smooth and uniform coat of photoresist on the polymer surface. The substrate is placed in the oxygen plasma for 1 minute at an RF power of 100 Watts with oxygen flowing at 300 sccm. The photoresist features are then UV exposed at 279 mJ and developed in AZ developer mixed 1:1 with water for 70 sec. Then the wafer is rinsed under a gentle stream of water and dried using N2. The wafer is placed for a second time in the oxygen plasma to activate the newly exposed silicone surface, and promote adhesion of the metal, which is deposited in the next step.

In step 103 a 150 nm gold film is e-beam evaporated or sputtered onto the wafer using titanium as the adhesion layer. The e-beam needs to be sufficiently cooled down before removing the parts. Cool down is conducted for 10 min. under vacuum and for 20 min. with the system vented, but not open. The metal adheres to the silicone surface in regions where the photoresist was removed, and the excess metal is removed through a lift-off process by placing the wafer in acetone. The wafer is then prepared for the next step by rinsing with ethanol and drying gently. If the silicone surface is contaminated or aged, it can be refreshed by soaking in a 20% solution of HCl for 8 min.

The embodiment 100 can be used to produce electronic devices. Examples of electronic devices that can be produced include but are not limited to the following: implantable devices including epiretinal, subretinal, and cortical artificial vision implants; cochlear implants, neurological implants, spinal cord implants, and other neural interface implants; implantable and transdennal drug delivery devices; monitoring devices; implantable electrode arrays including arrays for deep brain stimulation, spinal cord reattachment, nerve regeneration, cortical implants, retinal implants, and cochlear implants; drug delivery, muscle stimulation and relaxation, flexible displays, smart notes, conformable circuits, sensors, radios, recorders, cameras, cell phones, computers, calculators, surveillance devices, medical devices, radiation monitors, biological and biomedical devices, and other devices. The embodiment 100 can also be used to produce electronic components including, but not limited to, power sources, batteries, solar cells, wireless electronics for communication, capacitors, resistors, inductors, transformers, integrated circuits, microprocessors, digital to analog converters, displays, and other components.

Figure 2:
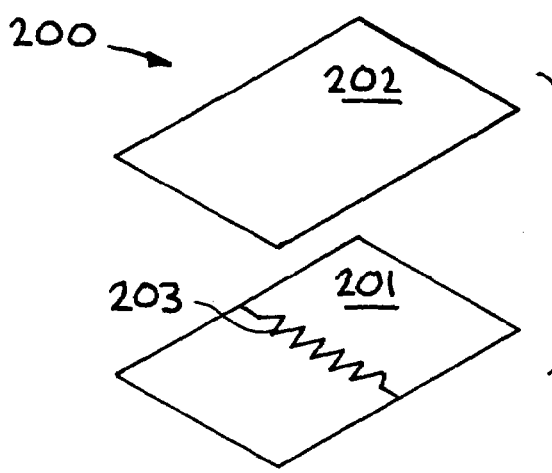
FIG. 2 shows an example of an electronic device produced by the embodiment illustrated in FIG. 1.

Referring now to in FIG. 2, an example of an electronic device constructed by the embodiment of FIG. 1 is shown. The electronic device is generally designated by the reference numeral 200. The electronic device 200 comprises a flexible silicone body formed of silicone sections 201 & 202 and a resistor or resistance element 203 operatively connected to the flexible silicone body. The electronic device 200 provides a heater when the element 203 is a resistance element and provides an electronic component when the element 203 is a resistor. The electronic device 200 can be visualized as a thin, clear, and flexible device that can be very small and adaptable.

The electronic device 200 comprises a flexible silicone body made of sections 201 & 202. The sections 201 & 202 can be composed of a number of silicones whose properties are determined by the organic groups and that have characteristics that include one or more of being fluid, resinous, rubbery, stable in high temperatures, and hydrophobic. The body section 201 comprises a silicone substrate that serves as a silicone-based platform for integrating and packaging the resistor or resistance element 203. The resistor or resistance element 203 is integrated into the flexible silicone body by the combination of sections 201 & 202. The small, thin, clear, and flexible, electronic apparatus 200 is very adaptable and durable. The flexible silicone body 201 & 202 protects the resistor or resistance element 203 from the environment.

Figure 3:
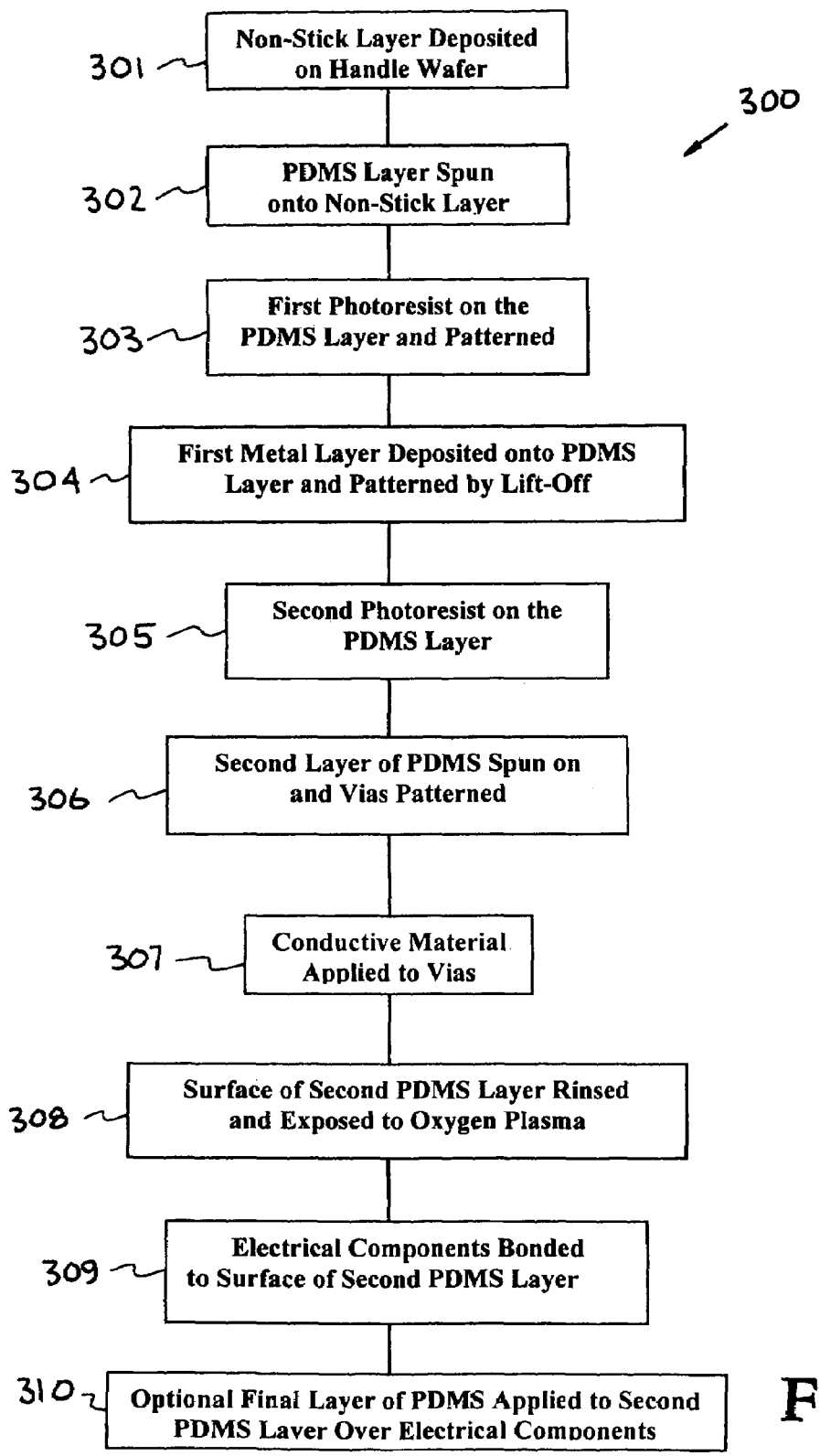
FIG. 3 is an illustration of another embodiment of a system for providing metal features on silicone.

Referring now to FIG. 3, another embodiment of the present invention is illustrated. The embodiment is designated generally by the reference numeral 300. The embodiment 300 can be used to produce a wide variety of electronic devices. Examples of electronic devices that can be produced include but are not limited to the following: implantable devices including epiretinal, subretinal, and cortical artificial vision implants; cochlear implants, neurological implants, spinal cord implants, and other neural interface implants; implantable and transdennal drug delivery devices; monitoring devices; implantable electrode arrays including arrays for deep brain stimulation, spinal cord reattachment, nerve regeneration, cortical implants, retinal implants, and cochlear implants; drug delivery, muscle stimulation and relaxation, flexible displays, smart notes, conformable circuits, sensors, radios, recorders, cameras, cell phones, computers, calculators, surveillance devices, medical devices, radiation monitors, biological and biomedical devices, and other devices. The embodiment 300 can also be used to produce electronic components including, but not limited to, power sources, batteries, solar cells, wireless electronics for communication, capacitors, resistors, inductors, transformers, integrated circuits, microprocessors, digital to analog converters, displays, and other components.

The embodiment 300 provides a process for depositing metal features on Poly(dimethylsiloxane) a type of silicone rubber. With the process applicants are capable of fabricating stretchable metal traces on PDMS (silicone) using a cost effective batch fabrication process. Applicants have demonstrated selective passivation of these metal traces with PDMS exposing the traces only in areas needed to make contact with the outside world. The embodiment 300 includes improvements in the process of metalizing PDMS, selective passivation, using batch fabrication photolithographic techniques to fabricate PDMS, and producing stretchable metal traces that are capable of withstanding strains of 7% with S.D. 1.

Applicants approach is to use PDMS as the substrate material to batch produces a low-cost device that is ready for implantation without the need for additional packaging steps. Because PDMS has not previously been used in this type of micromachining application, applicants developed new fabrication processes enabling PDMS patterning, metalization, and selective passivation. The metal features are embedded (deposited) within a thin substrate fabricated using poly(dimethylsiloxane) (PDMS), an inert biocompatible elastomeric material that has simultaneously low water and high oxygen permeability. The conformable nature of PDMS is critical for ensuring uniform contact with the curved surfaces.

PDMS is a form of silicone rubber, a material that is used in many implants and has been demonstrated to withstand the body's chemical and physical conditions without causing adverse side effects and is a favorable material to implant within the body. Robustness of the metalized PDMS is another important design criterion that applicants considered, as stretching and bending occur during fabrication and implantation of the device. The PDMS metalization process was demonstrated to produce devices that will be sufficiently rugged for implantation, with a demonstrated strain to failure of 7%, (SD=1). Applicants attribute the stretchability to a tensile residual stress from curing the PDMS.

In step 302, silicone is spun onto a silicon handle wafer. The silicone is poly(dimethylsiloxane) known as PDMS. PDMS has very low water permeability and protects the electronic components from the environment. PDMS is flexible and will conform to curved surfaces. It is transparent, stretchable, resinous, rubbery, and stable in high temperatures and provides numerous applications for the electronic devices produced by the method 300.

The silicon handle wafer provides a temporary base for production of the electronic device. Silicon wafers are convenient for the handle material because they are flat, stable, routinely used in microfabrication applications, and they are readily available. However, other materials such as glass, plastic, or ceramic could be used as well. The electronic devices will eventually need to be removed from the handle wafer. Since the flexible polymer layer would become permanently bonded to the surface of the silicon handle wafer, a non-stick layer is first provided on the silicon handle wafer. Step 301 comprises the deposition of gold (or platinum) onto the handle wafer. This allows for removal of the PDMS from the substrate after processing. The gold film facilitates removal of the polymer membrane from the wafer after completion of the fabrication process. Needed areas on the silicon wafer is left without the gold coating to prevent the PDMS membrane from lifting off during processing for example a 2 mm wide ring a the edge is left uncoated with gold. PDMS is then spun onto the wafer at a desired thickness and cured. For example the PDMS may be cured at 66° C. for 24-48 hours (or at manufactures' specifications). It is to be understood that the step 301 could be omitted if the surface on which the PDMS layer is deposited is such that the PDMS will not become bonded.

In step 303 the process of forming the electrical circuit lines and the antenna of the electronic system 100 is initiated. A photoresist (AZ®1518, Clariant) is spun onto the PDMS membrane surface at 1000 rpm for 20 seconds and baked at 60° C. for 45 minutes. The temperature is brought down slowly (30 min to ramp temperature down) to room temperature to avoid cracking in the photoresist. Prior to photoresist application, the wafer is placed in an oxygen plasma to activate the surface. This allows the resist to wet the PDMS surface preventing beading and ensuring the formation of a smooth and uniform coat of photoresist on the polymer surface. The substrate is placed in the oxygen plasma for 1 minute at an RF power of 100 Watts with oxygen flowing at 300 sccm. The photoresist features are then UV exposed at 279 mJ and developed in AZ developer mixed 1:1 with water for 70 sec. Then the wafer is rinsed under a gentle stream of water and dried using N2. The wafer is placed for a second time in the oxygen plasma to activate the newly exposed PDMS surface, and promote adhesion of the metal, which is deposited in the next step.

In step 304 a 150 nm gold film is e-beam evaporated onto the wafer using titanium as the adhesion layer. The e-beam needs to be sufficiently cooled down before removing the parts. Cool down is conducted for 10 min. under vacuum and for 20 min with the system vented, but not open. The metal adheres to the PDMS surface in regions where the photoresist was removed, and the excess metal is removed through a lift-off process by placing the wafer in acetone. The wafer is then prepared for the next step by rinsing with ethanol and drying gently. If the PDMS surface is contaminated or aged, it can be refreshed by soaking in a 20% solution of HCl for 8 min.

In steps 305 and 306 the process of forming the vias through a passivating layer of PDMS to connect the electrical circuit lines to the electronic components of the electronic system 100 is initiated. A thick photoresist is spun onto the PDMS membrane surface. The photoresist is patterned by exposing the resist to UV through a photomask and developing. The passivating layer of silicone is spun onto the wafer, over the patterned photoresist. The surface is gently swabbed to remove excess PDMS from the top of the photoresist features before stripping the resist. This ensures the removal of the photoresist and the complete clearance of the vias. To strip the resist the wafer is soaked in acetone for 15 min. and then soaked in isoproponol for 5 min. and then rinsed with isoproponol and dried.

Another way of patterning and passivation the PDMS is using a shadow-mask, which is a stencil-like mask exposing the areas needed to be passivated or patterned. A third way of passivating the PDMS is by protecting the areas needed for electrical connection and dipping the wafer in PDMS and curing.

In step 307 conductive material is applied to the vias. The vias can be filled with electroplating, conductive silicone adhesive, conductive ink or solder paste. An automated dispenser or applicator machine is used to deposit precise amounts of material in the vias locations. Alternatively, the conductive material can be screen-printed using conductive inks, or liquid ink can be injected into channels formed in the first PDMS layer. As another option, metal can be electroplated in the PDMS vias to form an array of electrical contacts.

In step 308, the surface of the second PDMS layer is rinsed with ethanol and exposed to an oxygen plasma. This activates the surface in preparation for bonding the electronic components to the PDMS. The following step is performed in a nitrogen environment in order to extend the lifetime of the activated surface.

In step 309, one or more components are bonded to the PDMS surface in order to make electrical contact and to seal and protect the underlying surface of the devices from the environment.

In step 310 an optional step of applying a final layer of PDMS to the second PDMS layer is included. The final layer is applied over the electrical components. This step is not required in all applications. When applied this step protects delicate components from the environment.

Figure 4:
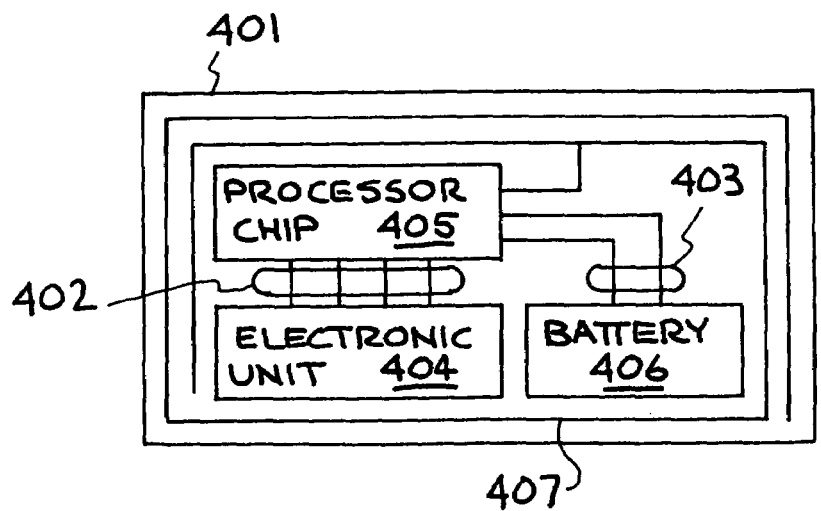
FIG. 4 shows another example of an electronic device that can be produced by the embodiments illustrated in FIGS. 1 and 3.

Referring now to in FIG. 4, another embodiment of a system constructed in accordance with the present invention is illustrated. The system is generally designated by the reference numeral 400. The system 400 comprises a silicone substrate 401, an electronic unit 404 operatively connected to the silicone substrate 401, a processor chip 405 operatively connected to silicone substrate 401, a battery 406 operatively connected to silicone substrate 401, and a circuit integrated into the silicone substrate 401 connecting the electronic unit 404, the processor chip 405, and the battery 406. The circuit comprises circuit lines 402 and 403. An antenna 407 allows information that has been obtained by the system 400 to be transmitted to a remote receiver. The antenna 407 is connected to the processor chip 405. The system 400 can be produced by the methods illustrated in FIGS. 1 and 3 and described above.

The electronic unit 404 can be a wide variety of electronic devices. Examples of some of the electronic devices that are utilized in different embodiments of the invention include the following: implantable medical device, radio, recorder, recorder and player, video camera, video player, video recorder, video recorder and player, computer, calculator, phone tap, gadget that detects phone taps, audio surveillance device, medical device, biosensor, radiation monitor, power source, wireless electronics for communication, integrated circuit, microprocessor, digital to analog converter, display, camera, cell phone, and other electronic devices.

Referring again to FIG. 4, the silicone substrate 401 comprises a poly(dimethylsiloxane) (PDMS) substrate or body that serves as a platform for integrating and packaging individual components. The electronic unit 404 is integrated into the body 401. The processor chip 405 is operatively connected and integrated into the body 401. The battery 405 provides power to the processor chip 405 and the electronic unit 404. The processor chip 405 and electronic unit 404 are connected by the metalization system 402 and 403. The battery 405 that provides power to the processor chip 405 and the electronic unit 404 is also connected by a metalization system. The antenna 407 allows information that has been obtained by the system 400 to be transmitted to a remote receiver.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method of providing metal features on silicone, comprising the steps of:
   providing a silicone layer on a matrix, wherein said step of providing a metal layer on said silicone layer produces stretchable metal traces that are capable of withstanding strains of 7% with S.D. 1, and
   providing a metal layer on said silicone layer.

* * * * *